United States Patent
Masuda et al.

[11] Patent Number: 5,593,495
[45] Date of Patent: Jan. 14, 1997

[54] METHOD FOR MANUFACTURING THIN FILM OF COMPOSITE METAL-OXIDE DIELECTRIC

[75] Inventors: Yoshiyuki Masuda, Noda; Ryusuke Kita, Matsudo; Hisako Arai, Kashiwa; Noboru Ohtani, Tokyo; Masayoshi Koba, Kashiwa, all of Japan

[73] Assignee: Sharp Kabushiki Kaisha, Osaka, Japan

[21] Appl. No.: 435,135

[22] Filed: May 5, 1995

[30] Foreign Application Priority Data

Jun. 16, 1994 [JP] Japan ................................. 6-134026

[51] Int. Cl.⁶ .................................................. C30B 1/10
[52] U.S. Cl. .................... 117/4; 117/7; 117/8; 117/945
[58] Field of Search ....................... 117/4, 7, 8, 945

[56] References Cited

U.S. PATENT DOCUMENTS

| 5,112,433 | 5/1992 | Dawson et al. | 423/593 |
| 5,198,269 | 3/1993 | Swartz et al. | 427/226 |
| 5,409,548 | 4/1995 | Hoffman | 501/134 |
| 5,453,661 | 9/1995 | Auciello et al. | 315/1 |
| 5,453,908 | 9/1995 | Tsu et al. | 361/321.5 |

FOREIGN PATENT DOCUMENTS

| 0375594 | 6/1990 | European Pat. Off. |
| 0485907 | 5/1992 | European Pat. Off. |
| 0516031 | 12/1992 | European Pat. Off. |
| 48-76098 | 10/1973 | Japan |
| 63-151672 | 6/1988 | Japan |

OTHER PUBLICATIONS

Soyama et al, "Preparation of Dielectric Thin Films from Photosensitive Sol–Gel Solution", Jpn. J. Appl. Phys. vol. 33 (1994) pp. 5268–5271.
M. N. Kamalasanan et al., Dielectric and ferroelectric properties . . . , J. Appl. Phys. 74(9), Nov. 1, 1993.
Reza Moazzami et al., IEEE Transactions on Electron Devices, vol. 39, No. 9, pp. 2044–2049 (Sep. 1992).
R. E. Jones et al., Appl. Phys. Lett. 60(8), pp. 1022–1024 (Feb. 24, 1992).
Hirano et al., Third Euro–Ceramics, Processing of Better . . . , vol. 2, pp. 685–698, Sep. 12, 1993.

*Primary Examiner*—Robert Kunemund

[57] ABSTRACT

In a method for manufacturing a thin film of metal-oxide dielectric, a precursor solution in a sol state is synthesized in a first step. This precursor solution is composed of component elements of materials of the composite metal-oxide dielectric to be manufactured. In a second step, this precursor solution is made a thin film by spin coating. In a third step, this thin film in the sol state is dried to convert it into a thin film of dry gel. Thereafter, in a fourth step, the thin film of dry gel is subjected to a heat treatment for thermally decomposing and removing organic substances in the dry gel thin film and simultaneously crystallizing this gel state thin film.

7 Claims, 4 Drawing Sheets

METHOD FOR MANUFACTURING THIN FILM OF COMPOSITE METAL-OXIDE DIELECTRIC

BACKGROUND OF THE INVENTION

1. Field of the Invention

The present invention relates to a method for manufacturing a thin film of metal-oxide dielectric used in a memory device, a pyroelectric device, a piezoelectric device, an electrooptic device, etc.

2. Description of the Related Art

Various kinds of applications of a composite metallic oxide dielectric are generally considered by using its electric characteristics in a field of electronics. For example, the composite metal-oxide dielectric is used in various kinds of devices such as an infrared linear array sensor using a pyroelectric property, a supersonic sensor using a piezoelectric property, a waveguide type optical modulator using electrooptic effects, a capacitor for a DRAM and a MMIC (Microwave Monolithic IC) using a high dielectric property, etc.

In particular, the area of a capacitor having a large capacity is reduced by using a material having a high dielectric constant in an integrated circuit (IC), such as GaAsMMIC, in which this capacitor is built.

For thin film material having such a high dielectric constant, a composite metal-oxide dielectric such as $SrTiO_3$ (strontium titanate), BST (barium strontium titanate), PLZT (lead lanthanum zirconate titanate), etc is used. A BST material is vigorously researched as a most promising material at the present time. When this thin film is practically used, the thin film of metal-oxide dielectric is desirably manufactured at a low temperature in a manufacturing process to improve temperature characteristics and adapt this manufacturing process to processes for manufacturing various kinds of semiconductor elements.

A manufacturing method of the thin film of metal-oxide dielectric uses a physical method such as a vacuum evaporation method, a sputtering method, a laser abrasion method, a chemical method such as a sol-gel method, a CVD (Chemical Vapor Deposition) method, etc. In the sol-gel method, organometal compounds are set to raw materials for starting and the thin film of metal-oxide dielectric is obtained by thermally decomposing these raw materials.

The sol-gel method is widely used in the manufacturing method of the thin film of metal-oxide dielectric since the raw materials can be uniformly mixed with each other at an atomic level and the dielectric thin film can be industrially manufactured at low cost.

A general method for manufacturing a BST thin film with respect to the sol-gel method will next be explained.

First, organometal compounds, such as alkoxides of barium, strontium and titanium, etc. are mixed with each other and are adjusted in a suitable solvent such as ethanol, propanol, butanol, methoxyethanol, acetic acid, etc. Thereafter, a thin film of a BST composite metal-oxide dielectric is manufactured in the following manufacturing processes.

(1) The organometal compounds are heated and stirred in an inert gas atmosphere of nitrogen, etc. to prepare a precursor solution of sol of composite alkoxide having a two-dimensional chain structure as shown in the following chemical formula 1.

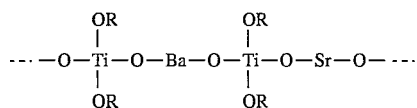

(2) This sol (the precursor solution) is applied on a substrate so as to form a thin film by a spin coating method, a dip coating method, etc. In this process, the sol of the two-dimensional chain structure is hydrolyzed by moisture in the air and becomes gel of a three-dimensional network structure as shown by the following chemical formula 2 by a condensation polymerization reaction subsequently caused.

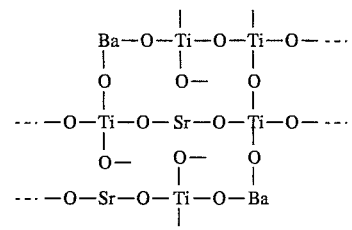

(3) The obtained gel formed in a film shape is heated and dried to separate alcohol reactively produced in the process (2) and the residual moisture not absorbed into the network structure from the film.

(4) The film is then subjected to a heat treatment at a temperature in a range from 350° C. to 450° C. to convert this gel state film into amorphous by thermally decomposing and removing organic components in the film.

(5) The film in the amorphous state is subjected to another heat treatment at a temperature in a range from 650° C. to 750° C. to crystallize this film.

The processes (2) to (4) are repeated plural times before carrying out the process (5) to obtain the thin film of a BST composite metal-oxide dielectric having a desirable thickness.

Thus, the thin film of the BST composite metal-oxide dielectric can be manufactured.

However, for example, it is necessary to set a film forming temperature to be equal to or lower than 600° C. for maintaining transistor characteristics in a Hetero-junction Bipolar Transistor (HBT) structure used in GaAsMMIC.

In the above general manufacturing method of the thin film of metal-oxide dielectric, it is difficult to provide a single orientation for the thin film of metal-oxide dielectric manufactured through the processes (4) and (5), i.e., manufactured by carrying out the heat treatment for crystallization after the process for converting the thin film into amorphous. Accordingly, the thin film is orientated at random. Further, for obtaining the thin film of metal-oxide dielectric having a high dielectric constant, it is necessary to heat the thin film at a high temperature in a range from 650° C. to 750° C. in crystallizing process such as the process (5) in the general manufacturing method of the thin film of metal-oxide dielectric.

SUMMARY OF THE INVENTION

It is therefore an object of the present invention to provide a method for manufacturing a thin film of metal-oxide dielectric having a high dielectric constant, even at low temperature.

To achieve the above object, a method for manufacturing a thin film of metal-oxide dielectric in the present invention comprises the steps of forming a thin film with a precursor solution in a sol state composed of component elements of materials of the composite metal-oxide dielectric; drying the thin film in the sol state to form dry gel thin films; and subjecting the obtained dry gel thin films to a heat treatment for thermally decomposing and removing organic substances within the dry gel thin films and simultaneously crystallizing the dry gel thin films.

In this manufacturing method, the precursor solution has Barium diethoxide, Strontium diethoxide and Titanium tetra-isopropoxide as components.

In this manufacturing method, a temperature of the heat treatment ranges from 500° C. to 600° C.

In the present invention, the above manufacturing method of the thin film of metal-oxide dielectric in a sol-gel method has the heat treatment for thermally decomposing and removing the organic substances from the dry gel thin film and simultaneously crystallizing the dry gel thin film. Accordingly, the thin film can be crystallized at a low temperature. Further, in the present invention, it is possible to manufacture the thin film of metal-oxide dielectric having a single orientation and a high dielectric constant.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a method for manufacturing the thin film of metal-oxide dielectric in the present invention will next be described in detail with reference to the accompanying drawings.

Figure 1:
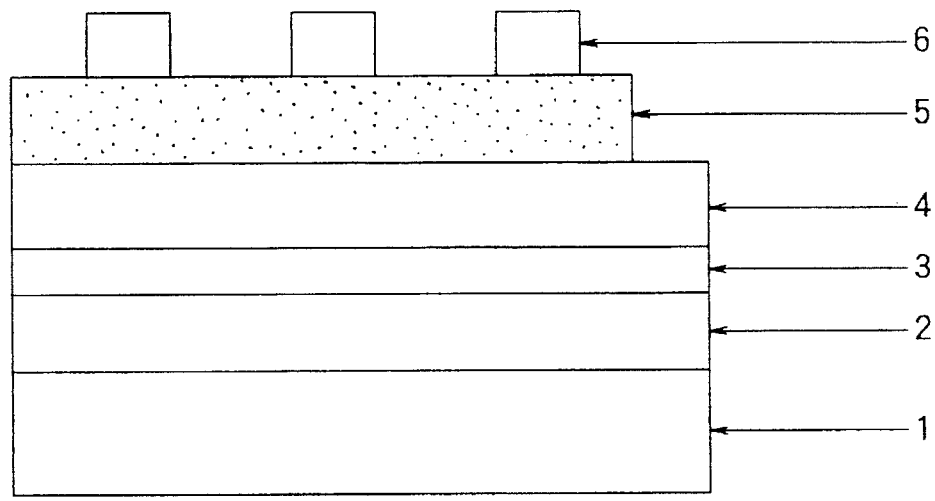
FIG. 1 is a cross-sectional view showing the construction of the dielectric thin film element of a composite oxide manufactured on the basis of a method for manufacturing the thin film of metal-oxide dielectric in accordance with one embodiment of the present invention.

FIG. 1 is a cross-sectional view showing the structure of a thin film element of a composite metal-oxide dielectric manufactured by a method for manufacturing the thin film of metal-oxide dielectric in accordance with one embodiment of the present invention. As shown in FIG. 1, a thermally grown silicon dioxide film 2 having 200 nm in thickness is formed on the surface of an n-type silicon substrate 1 in this thin film element of a composite metal-oxide dielectric. A titanium (Ti) film 3 having 30 nm in thickness, a platinum (Pt) film 4 having 200 nm in thickness, a $(Ba_{0.7}Sr_{0.3})TiO_3$ thin film 5 having 200 nm in thickness as a thin film of metal-oxide dielectric, and a platinum (Pt) upper electrode 6 having 100 nm in thickness are sequentially formed on the thermally grown silicon dioxide film 2. The $(Ba_{0.7}Sr_{0.3})TiO_3$ thin film 5 is called a BST thin film in the following description. The thermally grown silicon dioxide film 2 is formed as an insulating film constituting a passivation layer. In the present invention, this insulating film is not limited to the thermally grown silicon dioxide film 2. The platinum film 4 is used as a non-oxidizable film since an oxide film is formed on this platinum film 4. The titanium film 3 is used in consideration of a close contact property of the thermally grown silicon dioxide film 2 and the platinum film 4. A tantalum (Ta) film, a TiN film, etc. may be used instead of this titanium film 3.

The manufacturing method of the thin film element of a composite metal-oxide dielectric shown in FIG. 1 will next be explained.

First, the thermally grown silicon dioxide film 2 having 200 nm in thickness is formed on the surface of an n-type silicon substrate 1. In this embodiment, the thermally grown silicon dioxide film 2 is formed by thermally oxidizing the surface of the silicon substrate 1 at a temperature of 1000° C. A titanium (Ti) film 3 having 30 nm in thickness is formed on this silicon dioxide film 2 by a sputtering method. Further, a platinum (Pt) film 4 having 200 nm in thickness and (111) in orientation is formed on this titanium film 3. The obtained structure is used as a substrate.

Figure 2:
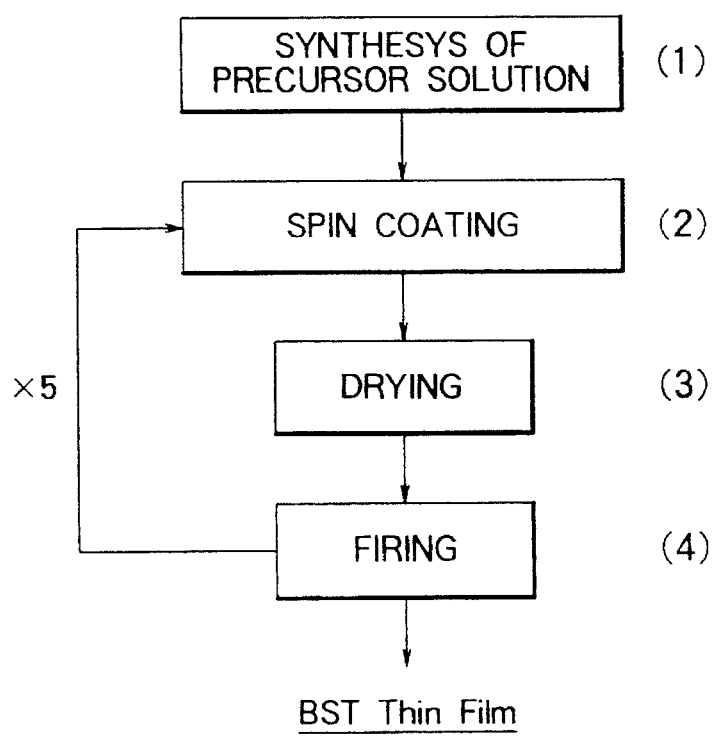
FIG. 2 is a flow chart showing manufacturing processes in accordance with one embodiment of the manufacturing method of the thin film of metal-oxide dielectric in the present invention.

Processes for forming a BST thin film as a thin film of metal-oxide dielectric on the platinum film 4 of this substrate will next be explained with reference to a flow chart shown in FIG. 2.

In a step 1, a precursor solution composed of sol of composite alkoxide having a two-dimensional chain structure is prepared as a precursor solution for forming a $(Ba_{0.7}Sr_{0.3})TiO_3$ thin film (as a BST thin film) by heating and stirring barium diethoxide $(Ba(OC_2H_5)_2)$, strontium diethoxide $(Sr(OC_2H_5)_2)$ and titanium tetra-isopropoxide $(Ti(OCH(CH_3)_2)_4)$ within isopropanol. In this embodiment, acetylacetone as a stabilizing agent is added to the precursor solution. Methoxyethanol, acetic acid, etc. can be used as a solvent of the precursor solution.

In a step 2, this precursor solution is dropped onto the above-mentioned substrate and is sequentially spin-coated in a condition in which the precursor solution is rotated for three seconds at 200 rpm. Then, the substrate is rotated for 20 seconds at 2000 rpm. The precursor solution is made a thin film by this spin coating process. Thus, a surface area of this precursor solution in a sol state is greatly increased. The precursor solution is formed as a film by this spin coating process. Accordingly, sol of the precursor solution formed as a film is hydrolyzed by moisture in the air during this spin coating process and a following period up to the next process. Thus, the sol of the precursor solution becomes gel of a three-dimensional network structure by a condensation polymerization reaction subsequently caused.

Next, in a step 3, the film is dried by subjecting it to a heat treatment for 10 minutes at a temperature of 100° C. to separate alcohol reactively produced and the residual moisture unabsorbed into the network structure from the film so that dry gel is obtained. In a step 4, a film of the obtained dry gel is fired by subjecting it to a heat treatment for 30 minutes at a temperature of 550° C. at atmospheric pressure to thermally decompose organic substances in the dry gel film and simultaneously crystallize the dry gel film.

The steps 2 to 4 are repeated so that the thin film of metal-oxide dielectric having a predetermined thickness can be obtained. In this embodiment, the steps 2 to 4 are repeated five times so that a BST thin film 5 having 200 nm in thickness can be obtained.

Figure 3:
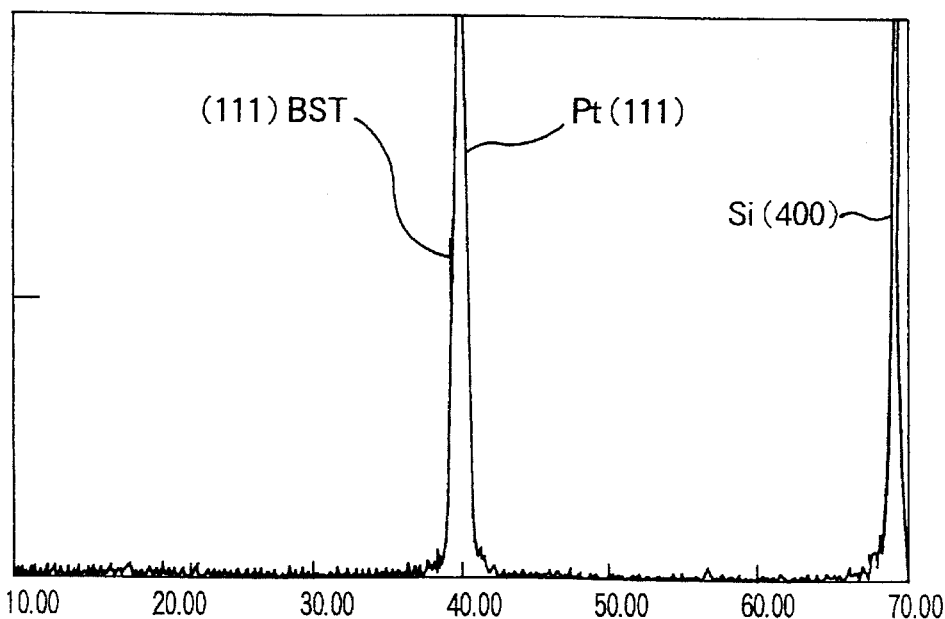
FIG. 3 is a view showing an X-ray diffractive pattern of the thin film of metal-oxide dielectric in this embodiment.

FIG. 3 shows measured results of an X-ray diffractive pattern of the BST thin film manufactured in this embodiment. In FIG. 3, a peak of (111) of the BST thin film is observed in addition to a peak of (400) of the silicon substrate and a peak of (111) of the platinum film. It should be understood from these results that the BST thin film manufactured in this embodiment is crystallized with a perovskite structure and a single orientation (111).

Figure 4:
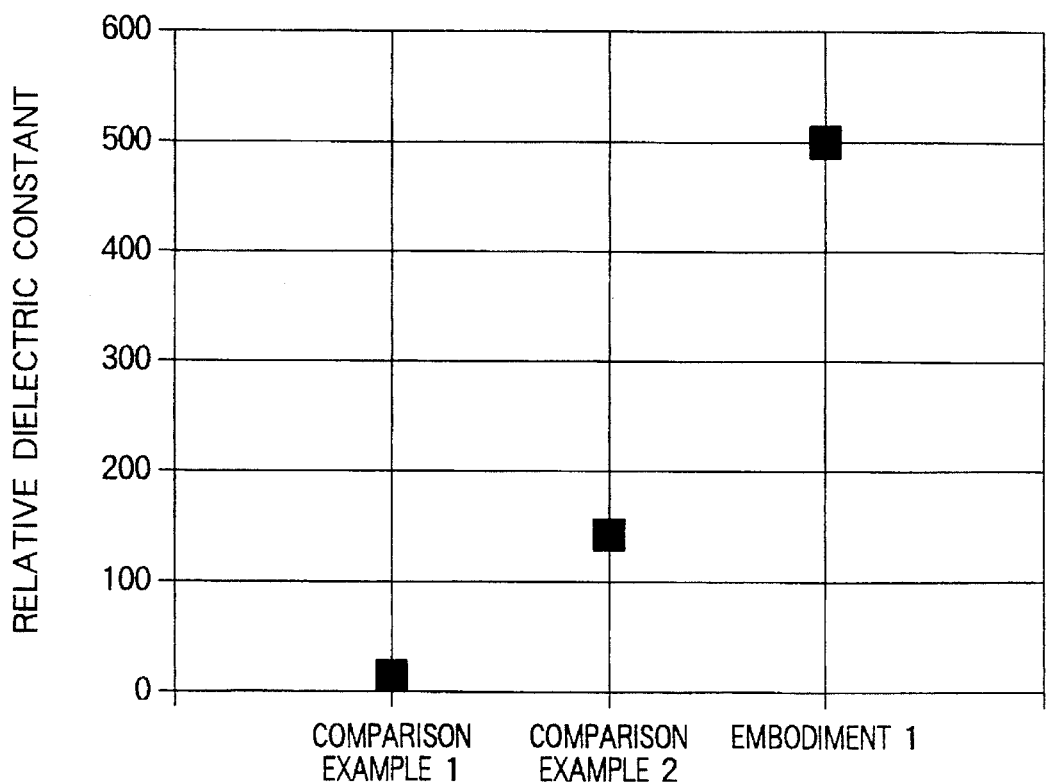
FIG. 4 is a view showing measured results of the dielectric constant of the thin film of metal-oxide dielectric in each of this embodiment and comparison examples 1 and 2.

A platinum (Pt) upper electrode 6 having 100 nm in thickness and 100 μm in diameter (φ) is formed on the manufactured BST thin film 5 by using a vacuum evaporation method. Then, a relative dielectric constant of the thin film is measured with an impedance analyzer by forming wiring between the platinum upper electrode 6 and a lower electrode composed of the titanium film 3 and the platinum film in a condition in which a measuring frequency is 1 kHz and an applied voltage is ±0.1 V. FIG. 4 shows measured results of the relative dielectric constant of the thin film. As shown in FIG. 4, the relative dielectric constant of the thin film is a very large value such as about 500.

In the above explanation for the embodiment, the step 4 in FIG. 4, that is the heat treatment for thermally decomposing and removing organic substances in the dry gel thin film and simultaneously crystallizing the thin film is carried out at 550° C. However, if this temperature is set to range from 500° C. to 600° C. and the other manufacturing conditions are similar to those in the above embodiment, it is possible to obtain a thin film of metal-oxide dielectric having a single orientation and a high dielectric constant.

Figure 5:
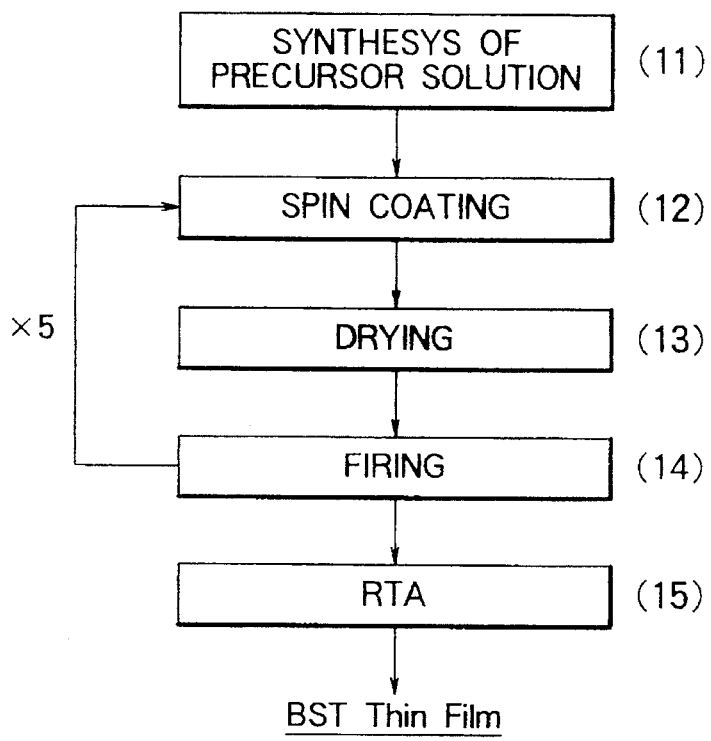
FIG. 5 is a flow chart showing manufacturing processes as one example in a method for manufacturing the thin film of metal-oxide dielectric in a comparison example.

A BST thin film is manufactured as a comparison example by manufacturing processes as shown in FIG. 5. In these manufacturing processes, steps 11 to 13 are similar to steps 1 to 3 in the above embodiment. However, steps 14 and 15 in the manufacturing processes are different from step 4 in the above embodiment. Accordingly, the steps 14 and 15 only will next be explained.

Dry gel is prepared by processes from the step 11 to the step 13. Then, organic substances in a film of dry gel are thermally decomposed and are removed from the dry gel film. In the step 14, this film is subjected to a heat treatment to fire it for 60 minutes at a temperature of 450° C. and atmospheric pressure such that this film attains an amorphous state. Then, the manufacturing processes from the step 12 to the step 14 are repeated five times so that a BST thin film having 200 nm in thickness is manufactured. In the step 15, rapid thermal annealing (RTA) as thermal treatment for crystallization is finally performed by using an infrared rapid thermal annealing system. Two kinds of BST thin films are manufactured in two manufacturing conditions of the RTA. In a first manufacturing condition, the BST thin film is heated for 15 seconds at a temperature of 550° C. under a 100% oxygen atmosphere at atmospheric pressure. In a second manufacturing condition, the BST thin film is heated for 15 seconds at a temperature of 650° C. under a 100% oxygen atmosphere at atmospheric pressure. The BST thin film manufactured in the first manufacturing condition is shown in the comparison example 1. The BST thin film manufactured in the second manufacturing condition is shown in the comparison example 2.

Figure 6:
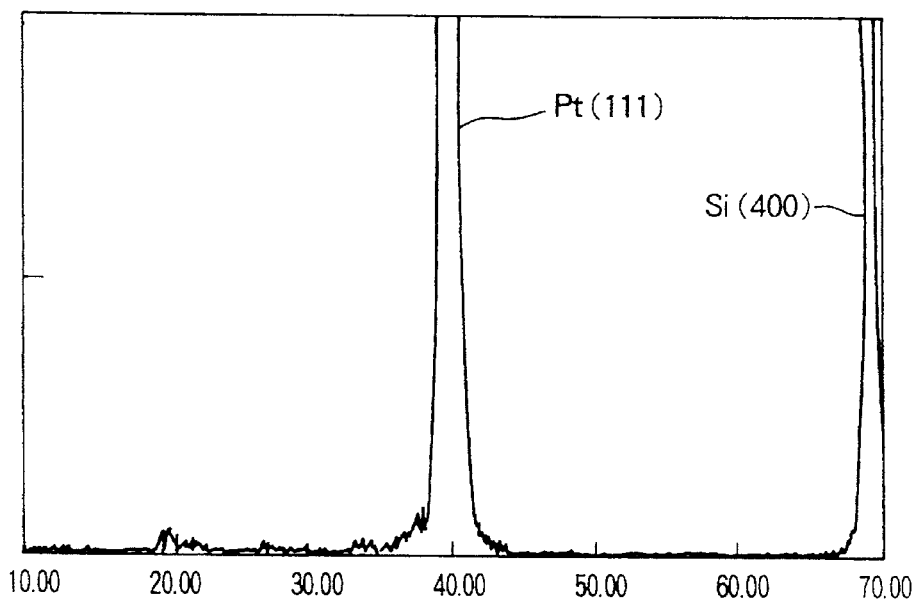
FIG. 6 is a view showing an X-ray diffractive pattern of the thin film of metal-oxide dielectric in the comparison example 1.
Figure 7:
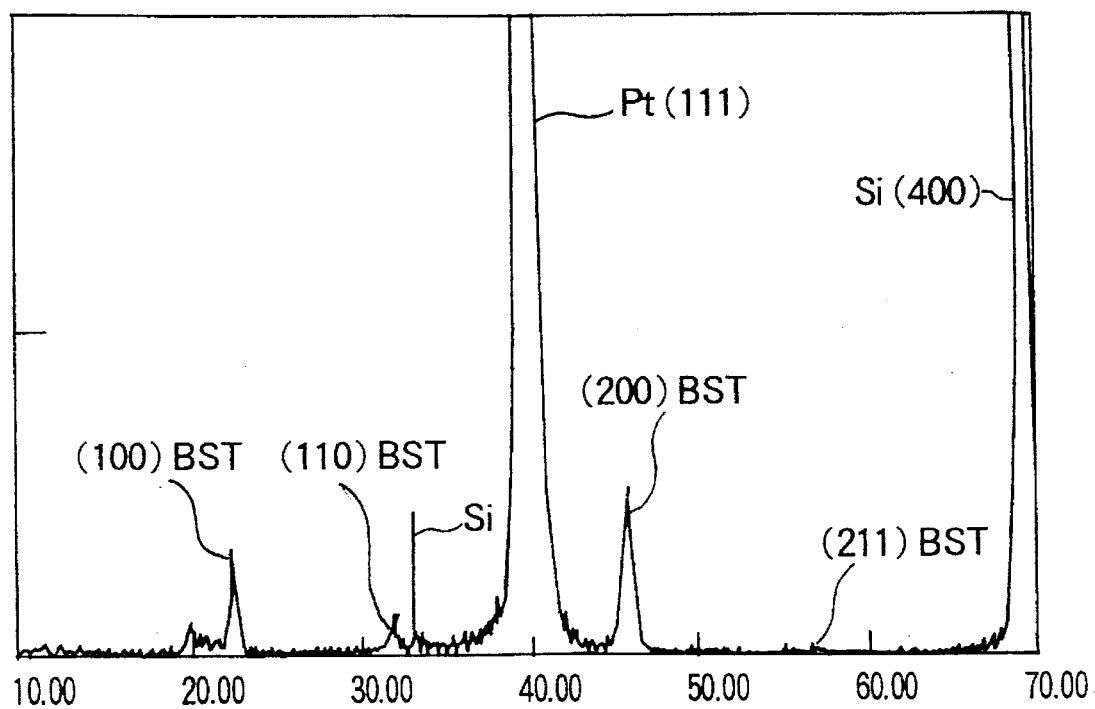
FIG. 7 is a view showing an X-ray diffractive pattern of the thin film of metal-oxide dielectric in the comparison example 2.

FIG. 6 shows measured results of an X-ray diffractive pattern of the BST thin film in the above comparison example 1. FIG. 7 shows measured results of an X-ray diffractive pattern of the BST thin film in the above comparison example 2. In FIG. 6, only peaks of (400) of a silicon substrate and (111) of a platinum film are observed in the comparison example 1 in which the RTA is performed at the temperature of 550° C. Accordingly, it should be understood that no BST thin film is crystallized in the comparison example 1. In contrast to this, in FIG. 7, peaks of (100), (110), (200) and (211) of the BST thin film are observed in addition to peaks of (400) of the silicon substrate and (111) of the platinum film in the comparison example 2 in which the RTA is performed at the temperature of 650° C. Accordingly, it should be understood that the BST thin film in the comparison example 2 is crystallized with a perovskite structure and random orientation.

Similar to the above embodiment, a platinum (Pt) upper electrode is formed on the BST thin film to measure a dielectric constant of the BST thin film in each of the comparison examples 1 and 2. The relative dielectric constant is measured in the same condition as the above embodiment. FIG. 4 shows measured results of this relative dielectric constant. As shown in FIG. 4, the relative dielectric constant is about 13 in the comparison example 1 and is about 160 in the comparison example 2. When the above embodiment and these comparison examples are compared with each other, it should be understood from these results that the thin film of metal-oxide dielectric manufactured by its manufacturing method in the present invention has a very high dielectric constant.

In the above embodiment, BST is used as a material of the thin film of metal-oxide dielectric. A material of the dielectric thin film is not limited to BST in the present invention. For example, the present invention can be also applied to a composite metal-oxide dielectric of Pb system such as PZT, PLZT, etc. as well as a material of a composite metal-oxide dielectric able to be formed as a film by a sol-gel method, such as STO(SrTiO$_3$).

In the above embodiment, the silicon substrate is used as a substrate. However, the substrate is not limited to the silicon substrate in the present invention. For example, a GaAs substrate, etc. can be used as the substrate. When the GaAs substrate is used, a silicon nitride film is formed on the GaAs substrate. Similar to the above embodiment, a lower electrode is then formed on the silicon nitride film so that the thin film of metal-oxide dielectric can be formed by the present invention.

As mentioned above, in the manufacturing method of the thin film of metal-oxide dielectric in the present invention, the thermal treatment for thermally decomposing and removing organic substances in the dry gel thin film and simultaneously crystallizing the dry gel thin film is employed. Therefore, it is possible to manufacture a thin film of metal-oxide dielectric having a single orientation and a high dielectric constant at a low temperature equal to or lower than 600° C. Accordingly, the present invention can be applied to a manufacturing method of the thin film of metal-oxide dielectric in an element having a HBT structure, etc. used in GaAsMMIC in which a film forming temperature equal to or lower than 600° C. is required to maintain characteristics of this element.

Further, the thin film of metal-oxide dielectric can be also used as a thin film having a high dielectric constant. In a general manufacturing process of a semiconductor element of a highly integrated circuit, a temperature for forming a thin film having a high dielectric constant is high so that orders of processes for forming a capacitor having a high dielectric constant are restricted. However, this problem can be solved by the present invention. Namely, in accordance with the present invention, the thin film having a high dielectric constant can be formed at a low temperature. Therefore, it is possible to reduce the restriction on orders of processes for forming a capacitor having a high dielectric constant. Accordingly, a degree of freedom in design of the semiconductor element of the highly integrated circuit can be increased so that various element structures can be designed. Further, since the degree of freedom in element design can be increased, manufacturing cost of the thin film can be reduced by forming the thin film at a low temperature and cost of the semiconductor element can be also reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for manufacturing a thin film of composite metal-oxide dielectric, comprising the steps of:

a) preparing a precursor solution in a sol state containing component elements of materials of the composite metal-oxide dielectric;

b) forming a thin film in a sol state with said precursor solution;

c) drying the thin film in the sol state by removing residual moisture therefrom to form a thin film of dry gel;

d) subjecting an obtained dry gel thin film to a heat treatment at 500° to 600° C. for thermally decomposing and removing organic substances within the thin film in the gel state and simultaneously crystallizing the obtained dry gel thin film; and e) repeating steps (b) to (d) several times to obtain a thin film of composite metal-oxide dielectric having a desired thickness.

2. A method for manufacturing a thin film of metal-oxide dielectric as claimed in claim 1, wherein said precursor solution contains Barium diethoxide, Strontium diethoxide and Titanium tetra-isopropoxide.

3. A method for manufacturing a thin film of composite metal-oxide dielectric as claimed in claim 1, wherein an obtained thin film of composite metal-oxide dielectric is of $(Ba_{0.7}Sr_{0.3})TiO_3$.

4. A method for manufacturing a thin film of composite metal-oxide dielectric as claimed in claim 1, wherein the thin film obtained in step (e) has a thickness of 200 nm.

5. A method for manufacturing a thin film of composite metal-oxide dielectric as claimed in claim 1, wherein drying step (c) occurs at a temperature of 100° C. for ten minutes.

6. A method for manufacturing a thin film of composite metal-oxide dielectric as claimed in claim 1, wherein drying step (c) occurs at a temperature of 100° C.

7. A method for manufacturing a thin film of composite metal-oxide dielectric, consisting essentially of the steps of:

a) preparing a precursor solution in a sol state containing component elements of materials of the composite metal-oxide dielectric;

b) forming a thin film in a sol state on a substrate with said precursor solution;

c) drying the thin film in the sol state at 100° C. for ten minutes by removing residual moisture therefrom to form a thin film of dry gel;

d) decomposing thermally and removing organic substances within the thin film from step (c) and simultaneously crystallizing an obtained dry gel thin film from step (c) by subjecting the obtained dry gel thin film from step (c) to a heat treatment at 500° to 600° C.; and e) repeating steps (b) to(d) several times to obtain a thin film of composite metal-oxide dielectric having a desired thickness.

* * * * *